United States Patent
Chen et al.

(10) Patent No.: US 8,525,216 B2
(45) Date of Patent: Sep. 3, 2013

(54) LIGHT-EMITTING DIODE INTEGRATION SCHEME

(75) Inventors: Ding-Yuan Chen, Taichung (TW); Wen-Chih Chiou, Miaoli (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/269,968

(22) Filed: Oct. 10, 2011

(65) Prior Publication Data

US 2012/0025222 A1 Feb. 2, 2012

Related U.S. Application Data

(63) Continuation of application No. 12/535,525, filed on Aug. 4, 2009, now Pat. No. 8,058,669.

(60) Provisional application No. 61/092,484, filed on Aug. 28, 2008.

(51) Int. Cl.
 *H01L 33/00* (2010.01)
(52) U.S. Cl.
 USPC .......... 257/99; 257/59; 257/79; 257/88; 257/E33.057; 257/E33.062; 257/E33.066
(58) Field of Classification Search
 USPC .......... 257/59, 79, 99, E33.057, E33.062, 257/E33.066, 88
 See application file for complete search history.

(56) References Cited

U.S. PATENT DOCUMENTS

| | | | |
|---|---|---|---|
| 6,538,309 B1 * | 3/2003 | Hotta et al. | 257/678 |
| 7,329,905 B2 * | 2/2008 | Ibbetson et al. | 257/98 |
| 7,436,000 B2 * | 10/2008 | Kim et al. | 257/98 |
| 7,470,926 B2 | 12/2008 | Suehiro et al. | |
| 7,550,319 B2 * | 6/2009 | Wang et al. | 438/125 |
| 7,626,208 B2 * | 12/2009 | Yang et al. | 257/88 |
| 7,667,223 B2 * | 2/2010 | Suehiro et al. | 257/10 |
| 7,825,423 B2 * | 11/2010 | Shiraishi et al. | 257/98 |
| 7,868,332 B2 * | 1/2011 | Rho et al. | 257/79 |
| 7,872,279 B2 * | 1/2011 | Lin et al. | 257/99 |
| 7,875,533 B2 * | 1/2011 | Epler et al. | 438/478 |
| 7,875,897 B2 * | 1/2011 | Suehiro | 257/99 |
| 7,902,568 B2 * | 3/2011 | Morikawa et al. | 257/100 |
| 7,977,686 B2 * | 7/2011 | Ibbetson et al. | 257/88 |
| 2005/0253151 A1 | 11/2005 | Sakai et al. | |
| 2007/0138495 A1 | 6/2007 | Lin et al. | |
| 2007/0145383 A1 | 6/2007 | Rho et al. | |

FOREIGN PATENT DOCUMENTS

CN 101032034 A 9/2007
WO WO 2006/005062 A2 1/2006

* cited by examiner

*Primary Examiner* — Victor A Mandala
(74) *Attorney, Agent, or Firm* — Haynes and Boone, LLP

(57) ABSTRACT

A circuit structure includes a carrier substrate, which includes a first through-via and a second through-via. Each of the first through-via and the second through-via extends from a first surface of the carrier substrate to a second surface of the carrier substrate opposite the first surface. The circuit structure further includes a light-emitting diode (LED) chip bonded onto the first surface of the carrier substrate. The LED chip includes a first electrode and a second electrode connected to the first through-via and the second through-via, respectively.

20 Claims, 11 Drawing Sheets

US 8,525,216 B2

LIGHT-EMITTING DIODE INTEGRATION SCHEME

This application is a continuation U.S. patent application Ser. No. 12/535,525, filed Aug. 4, 2009, and entitled "Light-Emitting Diode Integration Scheme," which application further claims the benefit of U.S. Provisional Application No. 61/092,484 filed on Aug. 28, 2008, entitled "Light-Emitting Device Integration Scheme," which applications are hereby incorporated herein by reference.

TECHNICAL FIELD

This invention relates generally to electrical circuits and more particularly to integrating light-emitting diodes (LEDs) into electrical circuits.

BACKGROUND

Since light-emitting diodes (LEDs) offer increased functionality and efficiency compared to many other lighting technologies, LEDs are being used for an increasing number of lighting applications. For many lighting applications it is desirable to electrically connect LEDs with other electronic devices, including in some cases other LEDs. For example, when LEDs are used as light sources for illumination, it is convenient to power the LEDs with AC power supplies of voltages of 100 V or greater. Since LEDs are inherently low voltage DC devices, high voltage AC power cannot directly power an LED unless the LED is connected to a circuit that converts the AC power to low voltage DC power.

It has recently been discovered that LEDs can be directly powered by high voltage AC power by connecting the AC power to several interconnected LEDs. FIG. 1A illustrates an exemplary LED device that may be directly driven by a three-phase AC power source. An equivalent circuit diagram of the device in FIG. 1A is shown in FIG. 1B. FIG. 1B shows that the circuit contains six groups of paired LEDs; the groups being designated C11, C21, C12, C32, C13, and C33. Each group contains a pair of LEDs connected in parallel and oriented so that when one LED is forward biased, the other LED is reverse biased. The term anti-parallel will be used to refer to the arrangement of the LEDs in each group (i.e. connected in parallel and oppositely oriented). The circuit further includes paired LEDs C22, C23, and C31. The three-phase power is connected to contact points P1, P2, and P3.

The arrangement of LEDs in the circuit eliminates the need for a drive circuit. A voltage applied across serially connected LEDs will be distributed across the LEDs so that each LED sees only a fraction of the total voltage. Thus the serial connection between the various LED groups lowers the high voltage applied at the contact points so that each of the individual LEDs is subjected to a lower voltage. The circuit in FIG. 1B can continuously produce light from AC power because the anti-parallel arrangement of the LEDs in each of the groups ensures that one of the LEDs in each group will produce light regardless of the polarity of the power applied to the pair, and the distribution of the groups among the contact points ensures that at least one of the pairs of groups will be subjected to a non-zero voltage from one of the three phases. Thus the circuit shown in FIG. 1B allows a high AC drive voltage to be used to drive LEDs that otherwise will not be able to stand the high voltage without an additional drive circuit.

The device in FIG. 1A contains the circuit from FIG. 1B monolithically formed on a single substrate. The six LED groups C11, C21, C12, C32, C13, and C33 and the three power contact points P1, P2, and P3 are disposed on a single surface of substrate SUB. The device shown in FIG. 1A suffers from drawbacks. FIG. 1A illustrates that in order to accommodate the circuit, a relatively large area substrate SUB is needed. Therefore, it is hard to form a compact AC-powered LED device if the connection scheme as shown in FIG. 1A is adopted. The situation is further worsened when far more than two LED groups are connected in series in order to distribute the voltage of a higher voltage AC power source.

Accordingly, what is needed in the art is an improved method of interconnecting a plurality of LEDs.

SUMMARY OF THE INVENTION

In accordance with one aspect of the present invention, a circuit structure includes a carrier substrate, which includes a first through-via and a second through-via. Each of the first through-via and the second through-via extends from a first surface of the carrier substrate to a second surface of the carrier substrate opposite the first surface. The circuit structure further includes an LED chip bonded onto the first surface of the carrier substrate. The LED chip includes a first electrode and a second electrode connected to the first through-via and the second through-via, respectively.

In accordance with another aspect of the present invention, a circuit structure includes a carrier substrate, which includes first contact pads on a first surface of the carrier substrate; and second contact pads on a second surface of the carrier substrate opposite the first surface. Each of the second contact pads is connected to one of a first through-vias and a second through-vias. The circuit structure further includes through-vias extending from the first surface to the second surface of the carrier substrate, wherein each of the first contact pads and the second contact pads is connected to one of the through-vias; LED chips bonded onto the first surface of the carrier substrate, wherein each of the LED chips comprises a first electrode and a second electrode, each being connected to one of the first contact pads; and connection wires on the second surface of the carrier substrate and electrically interconnecting the LED chips.

In accordance with yet another aspect of the present invention, a circuit structure includes a carrier substrate, which includes through-vias; and contact pads on a first surface of the carrier substrate, wherein each of the contact pads is connected to one of the through-vias. The circuit structure further includes LED chips bonded onto the first surface of the carrier substrate, wherein each of the LED chips includes a first electrode and a second electrode on a same surface, each being bonded to one of the contact pads through direct bonding; and a sacrificial substrate attached to the LED chips. The sacrificial substrate is on an opposite surface of the LED chips than the carrier substrate.

The advantageous features of the present invention include reduced area usage of the carrier substrate and reduced heat to affect LED chips.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Improved methods of interconnecting light-emitting diodes (LEDs) and connecting LEDs to other devices in a circuit are provided. To illustrate these improved methods, a device comprising several interconnected LEDs that is capable of being driven by an AC power source is used as an illustrative embodiment. The unique process steps required for manufacturing the illustrative embodiment are described. Those steps may be integrated in standard LED device fabrication processes. The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention. Throughout the various views and illustrative embodiments of the present invention, like reference numbers are used to designate like elements.

Figure 2:
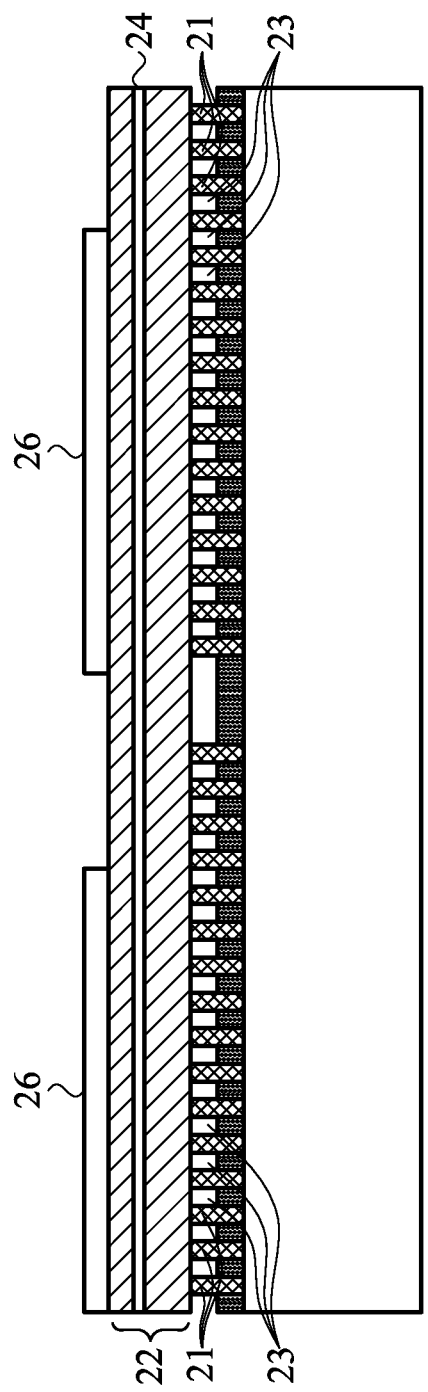
FIGS. 2 through 6 are cross-sectional views of stages in the manufacturing of an embodiment of the present invention.

FIG. 2 illustrates substrate 20 and group-III nitride (referred to as being III-nitride hereinafter) layers 22 formed on substrate 20, wherein III-nitride layers 22 comprise the nitrides of group-III element(s). Substrate 20, which is also referred to as being a sacrificial substrate, is preferably a silicon substrate having, for example, a (100), (110), or (111) surface orientation, although other substrates commonly used for forming III-nitride materials thereon, such as sapphire, silicon carbon, or the like, may also be used. III-nitride layers 22 are used for forming LEDs. In an exemplary embodiment, III-nitride layers 22 include active layer 24, which is used for emitting light, and other layers for supporting the operation of the respective LED devices, such as cladding layers. As is known in the art, the layers overlying and underlying active layer 24 typically have opposite conductivity types. In the subsequent discussion, the III-nitride layers over active layer 24 are referred to as upper III-nitride layers, while the III-nitride layers under the active layer 24 are referred to as lower III-nitride layers.

Preferably, III-nitride layers 22 and the underlying substrate 20 are only weakly bonded together, which means that III-nitride layers 22 and the underlying substrate 20 may be separated in subsequent process steps without damaging either III-nitride layers 22 or substrate 20. In an embodiment, the weak bonding is formed through columns 21 with air-gaps 23 separating columns 21 from each other. III-nitride layers 22 are then formed as continuous layers by means of the epitaxial lateral overgrowth (ELOG) technique, and hence air-gaps 23 are sealed under III-nitride layers 22. In alternative embodiments, the weak bonding comprises a porous layer between substrate 20 and III-nitride layers 22. The porous layer may be formed by converting a portion of substrate 20 to a porous layer. In an embodiment in which substrate 20 is a bulk silicon substrate, the porous layer may be formed by, for example, an electro-chemical anodization process using an electrolyte composition comprising an aqueous solution of hydrofluoric acid (about 20% by mass) and ethylic alcohol. In an exemplary embodiment, the chemical anodization process may be performed with an anodic current density of about 1 mA/cm$^2$ to about 200 mA/cm$^2$. Before forming the porous layer, substrate 20 may have a thickness greater than about 100 µm. The porous layer may have a thickness between about 10 Å and about 1 µm.

A plurality of upper electrodes/reflectors 26 (referred to as reflectors 26 hereinafter), which are used for reflecting light, is formed over III-nitride layers 22. Exemplary materials of reflectors 26 include multi layers containing Ni/Au, titanium, titanium nitride, tantalum, tantalum nitride, or combinations thereof. Each of reflectors 26 may also include a titanium nitride layer on a tantalum nitride layer, or a tantalum nitride layer on a titanium nitride layer.

Figure 3:
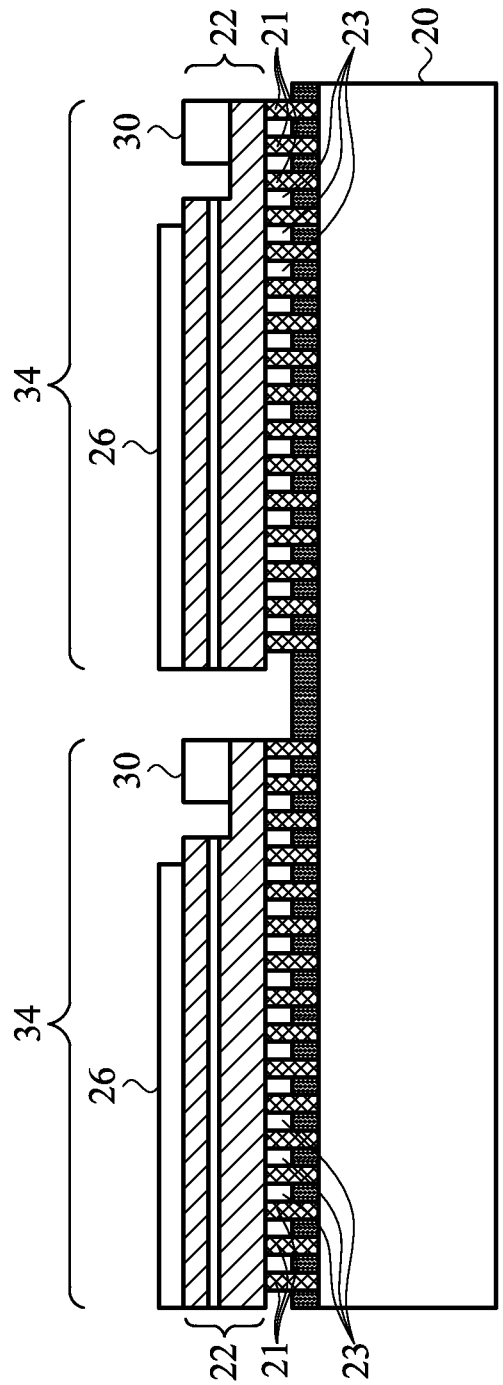

FIG. 3 shows the patterning of the continuous III-nitride layers 22 from FIG. 2. The patterning process employs standard photolithographic and etching processes known in the art to expose the lower III-nitride layer. After III-nitride layers 22 are patterned, electrodes 30 are then formed on the lower III-nitride layer. FIG. 3 also shows the result of a separate patterning process in which III-nitride layers 22 are patterned to form a plurality of separate LED chips 34. Each of the separate LED chips is activated by applying an appropriate voltage between its reflector 26 and other electrode 30.

Figure 4:
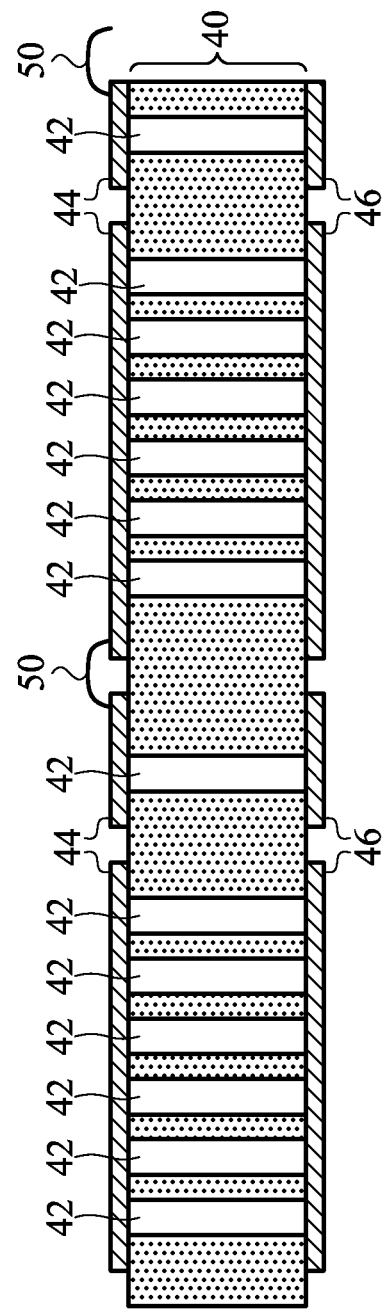

FIG. 4 illustrates carrier substrate 40 comprising a plurality of through-vias 42. In one embodiment carrier substrate 40 is a silicon substrate wherein each of through-vias 42 is a through-silicon via. In an alternative embodiment, carrier substrate 40 is a printed circuit board (PCB) comprising a plurality of through-vias 42. For simplicity both through-silicon vias and through-vias will both be subsequently referred to as through-vias. A plurality of contact pads 44 and 46 are formed on the top and bottom surfaces of carrier substrate 40, wherein each of the plurality of contact pads 44 on the top surface of the carrier substrate 40 is connected to one of the plurality of contact pads 46 on the bottom surface of the carrier substrate 40 through one of the plurality of through-vias 42. Optionally, at this time, electrical connections 50 are bonded to some of contact pads 44 in order to interconnect desirable contact pads 44. In the embodiment shown in FIG. 4, electrical connections 50 comprise connection wires. Alternatively, the desirable contact pads 44 may be electrically connected using other methods, such as conductive traces patterned onto the top surface of the carrier substrate. In an embodiment, one of contact pads 46 may be connected to one of contact pads 44 through a plurality of through-vias 42.

Figure 5:
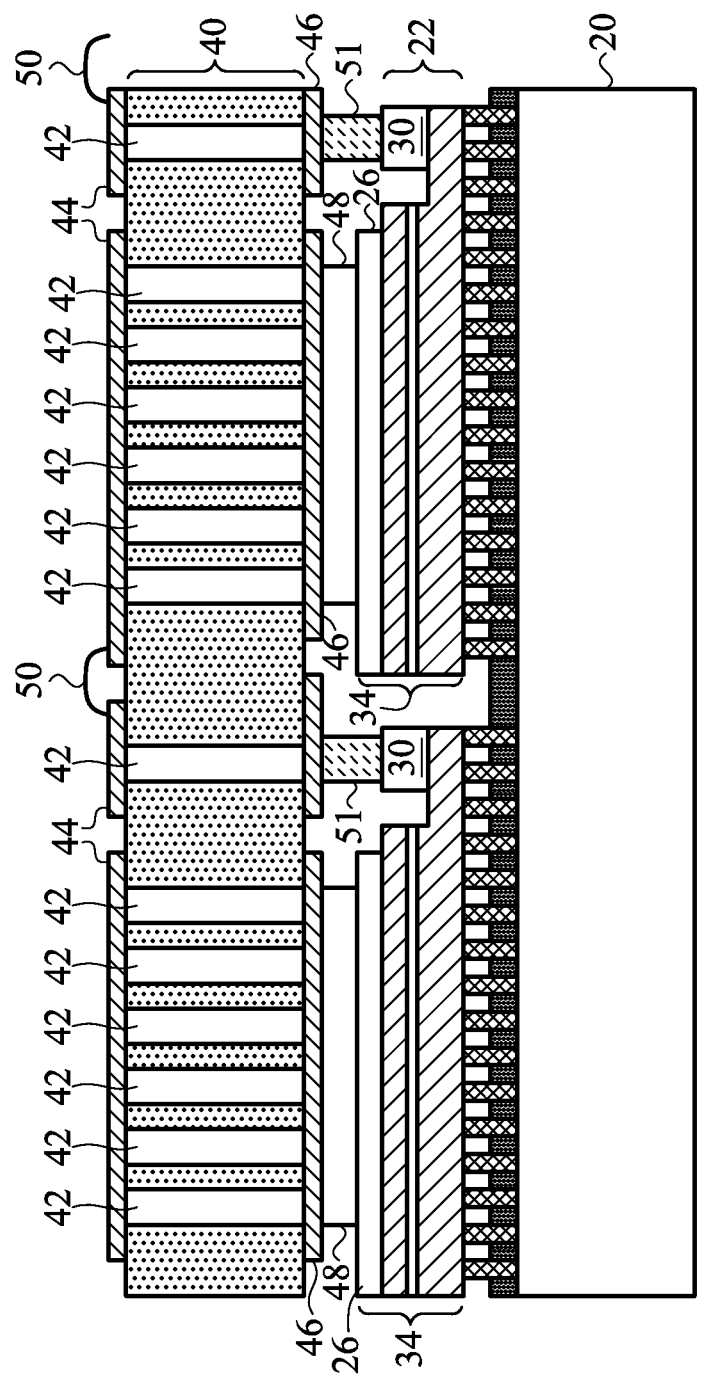

FIG. 5 shows the structure formed by flip-chip bonding carrier substrate 40 from FIG. 4 onto the combination of LED chips 34 and substrate 20 from FIG. 3. In the resulting structure, connections 48 are formed to connect the reflectors 26 to contact pads 46 on carrier substrate 40, while additional connections 51 are formed to connect the other electrodes 30 to other contact pads 46 on the carrier substrate 40. The connections are formed using standard flip-chip techniques. For example, the connections (48,51) may be formed using solder bonding, glue bonding, or direct metal-to-metal bonding, wherein a thin layer of solder or conductive glue (not shown) may be left between contact pads 46 and electrodes (30,48).

Figure 6:
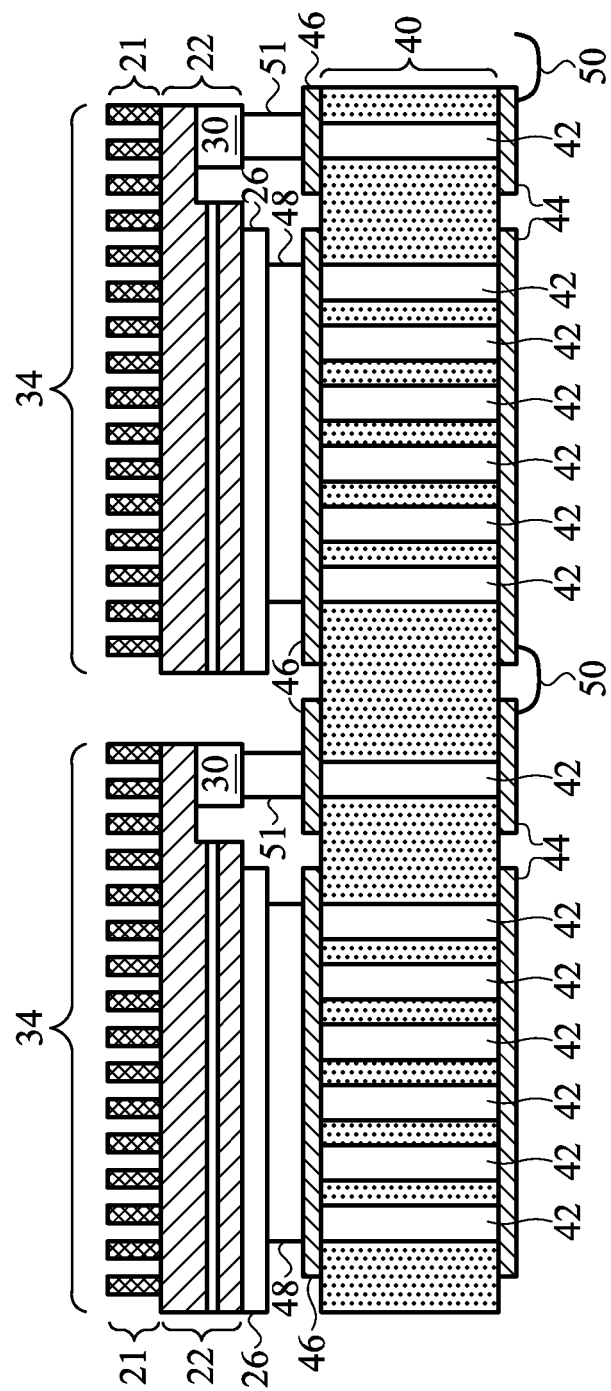

Next, as shown in FIG. 6, substrate 20 is separated from the rest of the structure as shown in FIG. 5. The separation is performed by breaking the weak connection between substrate 20 and LED chips 34. The weak connection, which may comprise columns 21 or a porous layer, is typically broken by an etch process, but it may be broken by other methods, such as mechanical cleaving. In the resulting structure, a residue of columns 21 or the porous layer may be generated. Preferably, the residue may be left without being removed and may improve the deflection of the light emitted by active layer 24. Connection wires 50 or other types of electrical connections may now be formed to interconnect LED chips 34 if they were not already interconnected in preceding steps. As previously discussed, electrical connections may also be formed using microelectronic processing techniques (such as deposition and patterning) instead of wire bonding during the process steps as shown in FIG. 4.

Figure 1A:
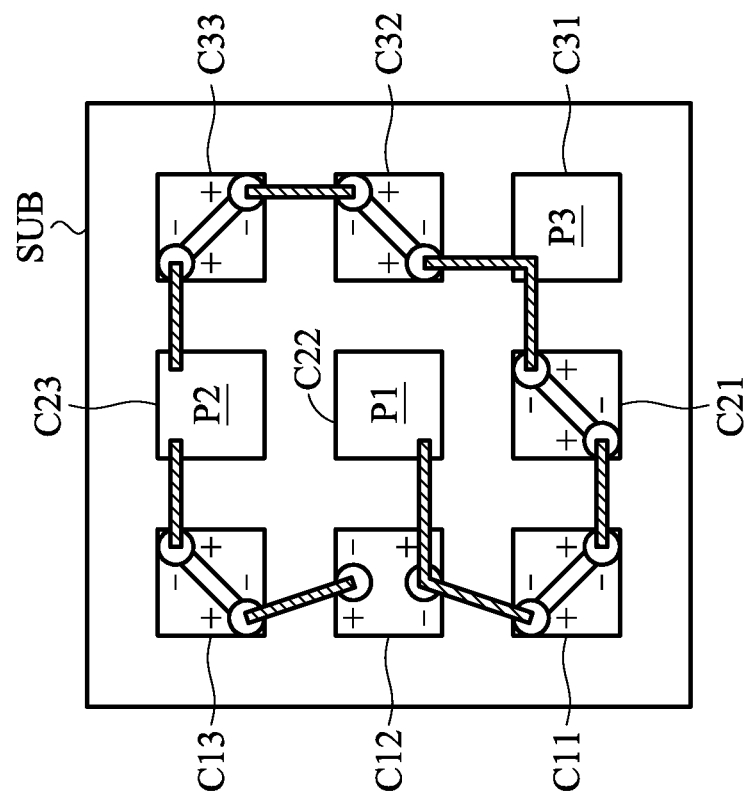
FIG. 1A illustrates an LED device that can be driven by AC power.
Figure 1B:
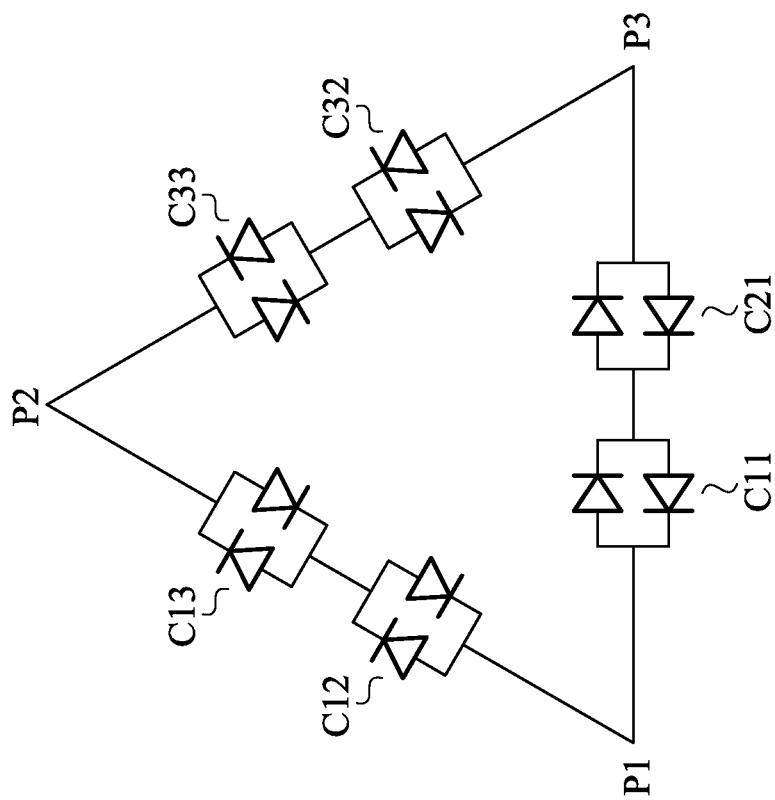
FIG. 1B illustrates a circuit diagram of the device shown in FIG. 1A.
Figure 7A:
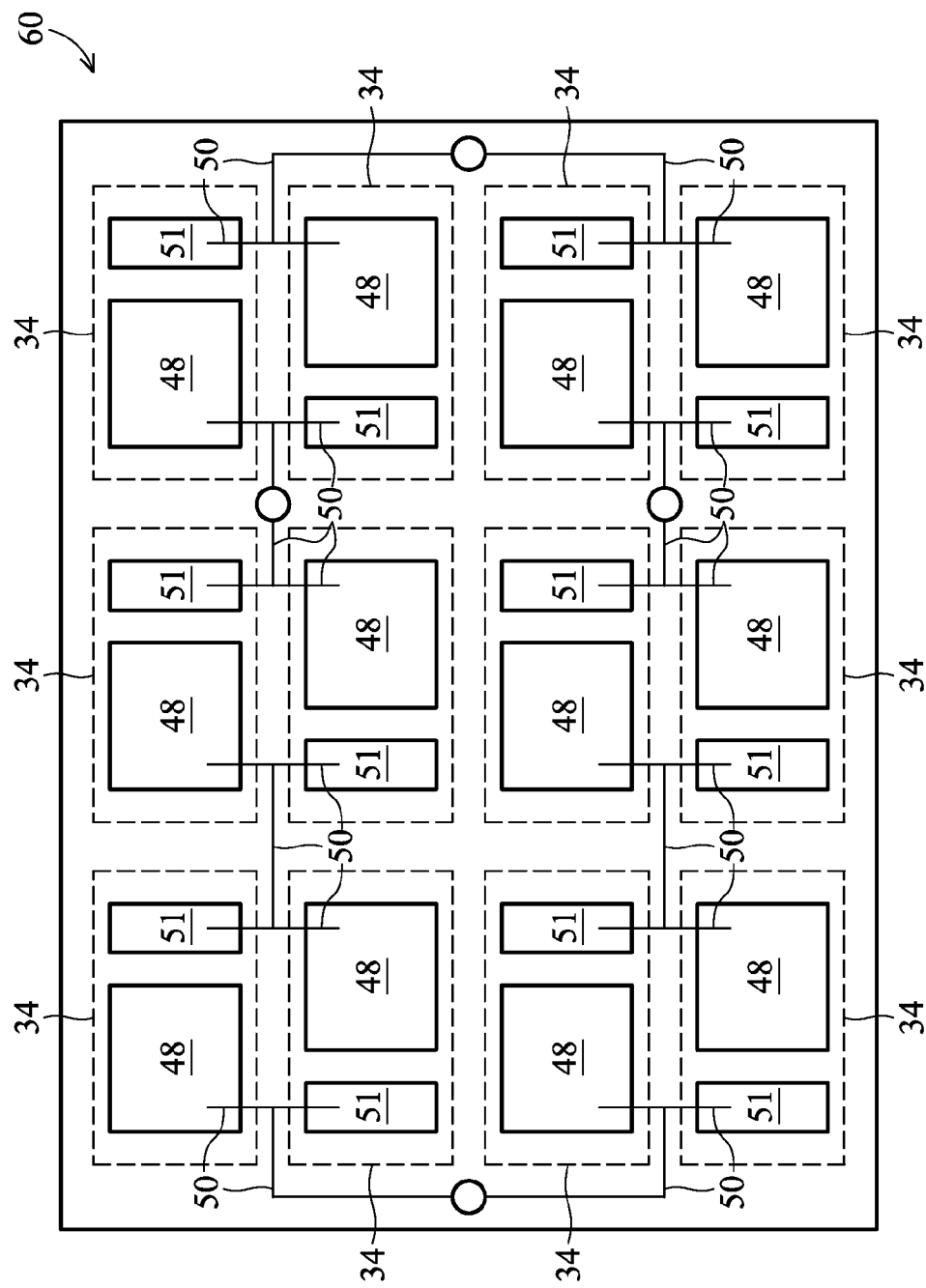
FIG. 7A illustrates a top view of an embodiment of the present invention.

FIG. 7A illustrates a schematic view of a top surface of carrier substrate 40 that may be used in accordance with the previously described methods to create an equivalent circuit to that shown in FIG. 1B. In this embodiment the LED chips are placed over the top surface of the carrier substrate, but in FIG. 7A, only the outline of LED chips 34 is shown as a dotted line so that the connections (48,51) between the electrodes on the LED chips and the contact pads (46 in FIG. 6, not shown in FIG. 7A) on the top surface of carrier substrate 40 can be seen. The connections (48,51) are in turn electrically connected to the contact pads (44 in FIG. 6, not shown in FIG. 7A) on the bottom (opposite) surface of carrier substrate 40 by through-vias (42 in FIG. 6, not shown in FIG. 7A). The location of connection wires 50 that connect pairs of contact pads on the bottom surface of the substrate are shown, although they are on the opposite surface of carrier substrate 40 from LED chips 34. Furthermore, power contact points (P1, P2, and P3 in FIG. 1B, not shown in FIG. 7A) may also be placed on the opposite surface of the carrier substrate 40 from the LED chips 34. Accordingly, LED chips 34 may be packaged tightly since the LED chips do not have to share one surface of carrier substrate 40 with the connection wires or power contact points. Therefore, the resulting LED device 60 is more compact than the device shown in FIG. 1A in which the area of carrier substrate 40 may be wasted due to the formation of contact pads and wiring between LED chips.

Figure 7B:
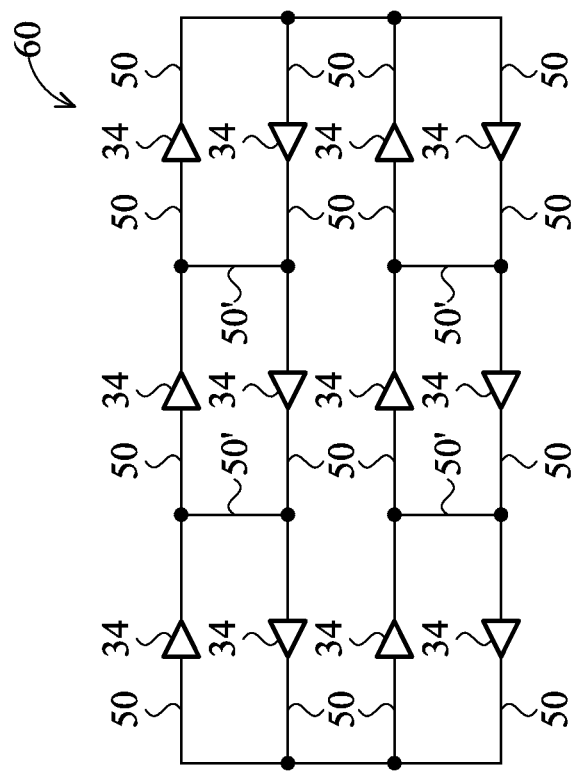
FIG. 7B illustrates a circuit diagram of the embodiment shown in FIG. 7A.

FIG. 7B is a circuit diagram of LED device 60 as shown in FIG. 7A. Note that in a real LED device, a significantly greater number of LED chips may be needed than shown in FIG. 7A. For example, if each of LED chips 34 has a working voltage of 4 volts, then about 28 LED chips need to be connected in series in order for the device to be connected to a standard 110V AC power. The circuit shown in FIG. 7B also illustrates that LED chips 34 may be grouped, with each group of LED chips 34 connected in series, with different groups being in anti-parallel orientation. That is, the head of the first group of LED chips is connected to the end of the second group of LED chips, and vice versa. Further, more connection wires 50 (marked as 50') may be used to connect intermediate nodes in different groups of LED chips 34.

Figure 8:
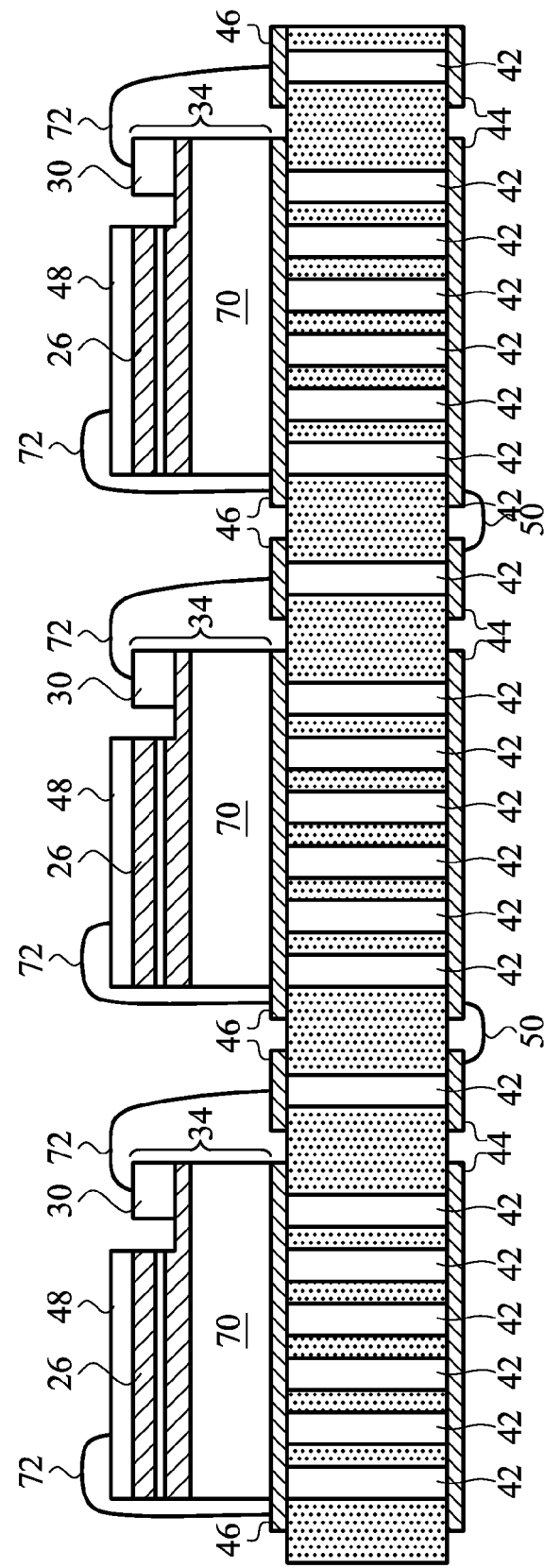
FIGS. 8 and 9 illustrate alternative embodiments of the present invention.

In the embodiment shown in FIGS. 2 through 6, LED chips 34 are connected to carrier substrate 40 using flip-chip technology, and substrate 20 on which LED chips 34 were fabricated is removed from the LED chips 34. In alternative embodiments, the LED chips 34 may remain attached to the substrate on which they fabricated. In one such embodiment shown in FIG. 8, LED chips 34 are diced along with the underlying substrate 70, and the completed LED chips 34 retain a portion of substrate 70. In the embodiment shown in FIG. 8, the portion of LED chips 34 made up of substrate 70 is bonded to carrier substrate 40, while the active portion of LED chips 34 is electrically connected to carrier substrate 40 using wire bonding. This embodiment is compatible with LED chips 34 that are fabricated on an insulating substrate 70. Each LED chip 34 has two electrodes, 26 and 30, electrically connected to the upper and lower III-nitride layers, respectively. In some embodiments it may be desirable to place a connection material 48 on top of one or both of the electrodes (26, 30). Bonding wires 72 are used to connect electrodes 26 and 30 to contact pads 46 on the surface of carrier substrate 40. Contact pads 46 are further connected to contact pads 44 on the other surface of carrier substrate 40 through through-vias 42. Contacts pads 44 can be interconnected through connection wires 50 to form an equivalent device to that shown in FIGS. 7A and 7B.

Figure 9:
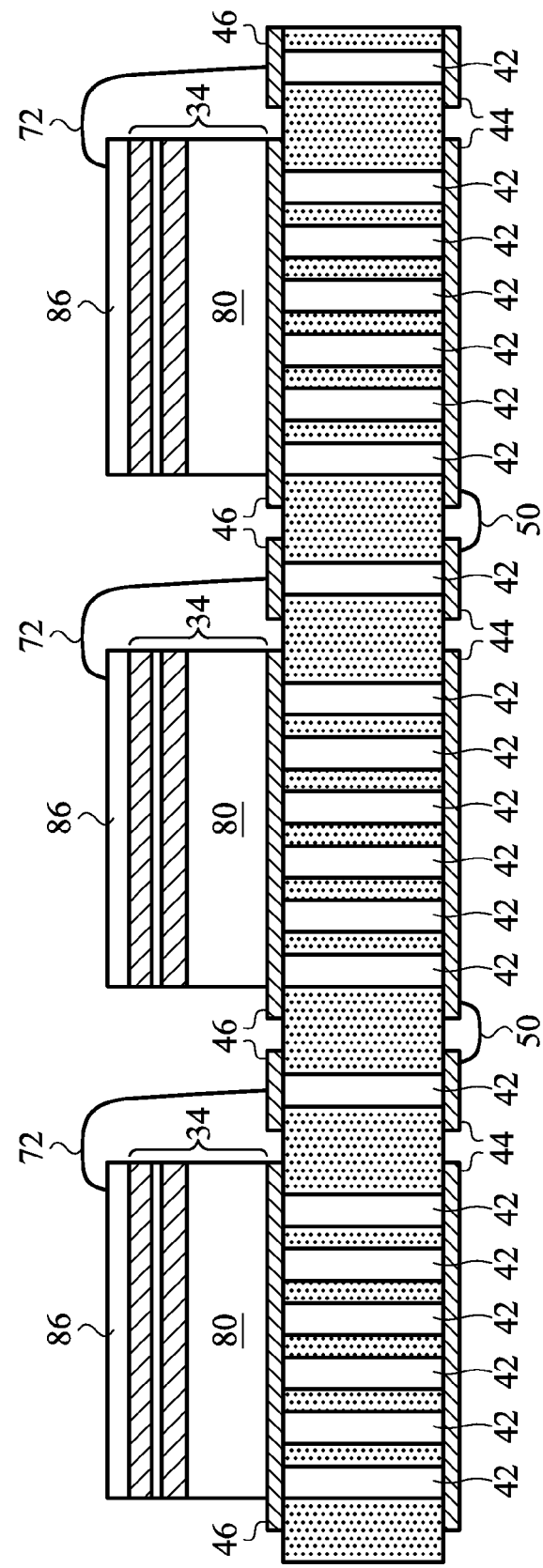

FIG. 9 illustrates yet another embodiment of the present invention in which LED chips 34 retain a portion of substrate 80 on which they were fabricated. This embodiment is compatible with LED chips 34 that are fabricated on a conductive substrate 80. Accordingly, substrate 80 can provide an electrical connection to the lower III-nitride layer on LED chips 34, so the substrate can be bonded on, and electrically connected to, contact pad 46 on the surface of carrier substrate 40. Electrode 86, connected to the upper III-nitride layer of LED chips 34, can be electrically connected to other contact pads 46 on the same surface of the carrier substrate through bonding wires 72. Again, contact pads 46 on one surface of carrier substrate 40 are connected to contact pads 44 on the other surface of carrier substrate 40 by through-vias 42. Contacts pads 44 on the other surface of carrier substrate 40 are further interconnected through connection wires 50 to form a completed LED device, such as an equivalent to the device shown in FIGS. 7A and 7B.

The embodiments of the present invention have several advantageous features over LED devices that are completely fabricated on one surface of a carrier substrate. By bonding LED chips onto one surface of a carrier substrate and placing connection wires and external contact points on the other surface of the carrier substrate, smaller area substrates may be employed to create more compact devices. Furthermore, by distributing the connection wires on an opposite surface of the carrier substrate than the LED chips, the LED chips are affected less by the heat created by the contact resistance between the wiring and the contact pads. The process steps for forming the embodiments of the present invention may also benefit from using a silicon substrate as a base for forming LED chips due to the low cost of silicon substrates. As a matter of fact, in the first described embodiment (shown in FIGS. 2-6) the silicon substrate 20, after being separated from carrier substrate 40, may be reused.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. For example, embodiments may be employed to interconnect LED chips with semiconductor chips by placing the LED chips and semiconductor chips on one surface of a carrier substrate, and interconnecting the various chips by means of connection wiring on the other surface of the carrier substrate. Similarly, embodiments could also integrate LED chips onto a semiconductor device by fabricating the device on one surface of a silicon substrate, fabricating through-silicon vias in the substrate, and bonding the LED chip onto the other surface of the silicon substrate. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention.

Accordingly, the appended claims are intended to include within their scope such processes, machines, manufacture, compositions of matter, means, methods, or steps.

What is claimed is:

1. A circuit structure comprising:
a carrier substrate comprising:
   a first and a second through-via, wherein each of the first and the second through-vias extends from a first surface of the carrier substrate to a second surface of the carrier substrate opposite the first surface;
   a first and a second contact pad on the first surface of the carrier substrate; and
   a third and a fourth contact pad on the second surface of the carrier substrate, wherein the third contact pad is electrically connected to the first contact pad through the first through-via, and the fourth contact pad is electrically connected to the second contact pad through the second through-via;
a light-emitting diode (LED) chip bonded onto the first surface of the carrier substrate, wherein the LED chip comprises a first electrode and a second electrode connected to the first contact pad and the second contact pad, respectively; and
electrical connections on the second surface of the carrier substrate and connecting the first and second through-vias to a power source, wherein the first and second through-vias are connected to the power source through an additional LED chip bonded onto the first surface of the carrier substrate.

2. The circuit structure of claim 1, wherein the electrical connections comprise conductive traces.

3. The circuit structure of claim 1, wherein the LED chip is flip-chip bonded to the carrier substrate.

4. The circuit structure of claim 1, wherein the carrier substrate is a silicon substrate, and wherein the first and the second through-vias are through-silicon vias.

5. The circuit structure of claim 1, wherein the carrier substrate comprises an inorganic substrate and metal traces on the inorganic substrate.

6. The circuit structure of claim 1, wherein the first LED chip has a porous surface facing away from the carrier substrate.

7. The circuit structure of claim 1, wherein the LED chip and the additional LED chip are interconnected by conductive traces on the second surface of the carrier substrate.

8. A circuit structure comprising:
a carrier substrate comprising:
   a first through-via; and
   a second through-via, wherein each of the first through-via and the second through-via extends from a first surface of the carrier substrate to a second surface of the carrier substrate opposite the first surface;
a first light-emitting diode (LED) chip bonded onto the first surface of the carrier substrate, wherein the first LED chip comprises a first electrode and a second electrode connected to the first through-via and the second through-via, respectively, and wherein a surface of the first LED chip not bonded to the carrier substrate includes a plurality of columns; and
electrical connections on the second surface of the carrier substrate, wherein the electrical connections connect the first and second through-vias to a circuit comprising other electronic devices, and wherein the electrical connections are conductive traces on the second surface of the carrier substrate.

9. The circuit structure of claim 8, wherein the other electronic devices comprise a second LED chip bonded on the first surface of the carrier substrate.

10. The circuit structure of claim 9, wherein the second LED chip comprises a third electrode and a fourth electrode, and wherein the circuit structure further comprises:
   a first electrical connection on the second surface of the carrier substrate and interconnecting the first electrode of the first LED chip and the third electrode of the second LED chip; and
   a second electrical connection on the second surface of the carrier substrate and interconnecting the second electrode of the first LED chip and the fourth electrode of the second LED chip.

11. The circuit structure of claim 9, wherein the other electronic devices further comprise a third LED chip bonded on the first surface of the carrier substrate, and wherein the second and the third LED chips are connected anti-parallel.

12. The circuit structure of claim 9, wherein the first electrode and the second electrode are electrically connected to a first and a second power contact points, respectively, and wherein connections to the first and a second power contact points are located on the second surface of the carrier substrate.

13. A circuit structure comprising:
a carrier substrate comprising:
   a plurality of contact pads on a first surface of the carrier substrate;
   a plurality of contact pads on a second surface of the carrier substrate opposite the first surface;
   a plurality of through-vias extending from the first surface to the second surface of the carrier substrate, wherein each of the plurality of contact pads on the first surface of the carrier substrate is connected by one of the through-vias to one of the plurality of contact pads on the second surface of the carrier substrate;
a plurality of LED chips bonded onto the first surface of the carrier substrate, wherein each of the plurality of LED chips comprises a first electrode and a second electrode, each electrode being connected to one of the plurality of contact pads on the first surface of the carrier substrate; and
a conductive trace on a side of the second surface of the carrier substrate, wherein the conductive trace interconnects two of the plurality of contact pads on the second surface of the carrier substrate.

14. The circuit structure of claim 13, wherein the conductive trace electrically connects two of the plurality of LED chips serially.

15. The circuit structure of claim 13 further comprising an additional conductive trace on the side of the second surface of the carrier substrate, wherein the conductive trace and the additional conductive trace electrically connect two of the plurality of LED chips in anti-parallel.

16. The circuit structure of claim 13 further comprising an additional conductive trace on the side of the second surface of the carrier substrate, wherein the additional conductive trace electrically connects the plurality of LED chips to a power contact point.

17. The circuit structure of claim 16, wherein the power contact point is electrically connected to the plurality of LED chips through a contact pad on the second surface of the carrier substrate.

18. The circuit structure of claim 13, wherein one of the plurality of contact pads on the first surface of the carrier substrate is connected by at least two of the through-vias to the one of the plurality of contact pads on the second surface of the carrier substrate.

19. The circuit structure of claim 13, wherein the plurality of LED chips comprises:
   a first subset of LED chips connected in series; and
   a second subset of LED chips connected in series, wherein the first subset of LED chips is anti-parallel to the second subset of LED chips.

20. The circuit structure of claim 13, wherein the first electrode of each of the plurality of LED chips is electrically connected to one of the plurality of contact pads on the first surface of the carrier substrate through a conductive substrate portion of each of the plurality of LED chips.

* * * * *